(12) United States Patent
Ohta

(10) Patent No.: US 12,224,356 B2
(45) Date of Patent: Feb. 11, 2025

(54) THIN FILM TRANSISTOR AND MANUFACTURING METHOD OF SAME, AND DISPLAY DEVICE

(71) Applicant: SAKAI DISPLAY PRODUCTS CORPORATION, Sakai (JP)

(72) Inventor: Hiroyuki Ohta, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 537 days.

(21) Appl. No.: 17/614,914

(22) PCT Filed: Jun. 4, 2019

(86) PCT No.: PCT/JP2019/022220
§ 371 (c)(1),
(2) Date: Nov. 29, 2021

(87) PCT Pub. No.: WO2020/245925
PCT Pub. Date: Dec. 10, 2020

(65) Prior Publication Data
US 2022/0238724 A1 Jul. 28, 2022

(51) Int. Cl.
*H01L 29/786* (2006.01)
*H01L 29/12* (2006.01)
(Continued)

(52) U.S. Cl.
CPC ...... *H01L 29/78696* (2013.01); *H01L 29/127* (2013.01); *H01L 29/66969* (2013.01);
(Continued)

(58) Field of Classification Search
CPC ......... H01L 29/66969; H01L 29/78687; H01L 29/7869–78696; H01L 29/122–127;
(Continued)

(56) References Cited

U.S. PATENT DOCUMENTS

| 2006/0038800 A1 | 2/2006 | Tokioka et al. |
| 2009/0218605 A1* | 9/2009 | Jain ..................... H01L 29/1054 |
| | | 257/E21.409 |

(Continued)

FOREIGN PATENT DOCUMENTS

| JP | 2011-187506 A | 9/2011 |
| JP | 2012-114428 A | 6/2012 |

(Continued)

*Primary Examiner* — Patricia D Valenzuela
(74) *Attorney, Agent, or Firm* — ScienBiziP, P.C.

(57) ABSTRACT

A thin film transistor 101 includes: an active layer 7 that is supported on a substrate 1 and includes a first region 7S, a second region 7D and a channel region 7C located between the first region and the second region; a gate electrode 11 that is arranged so as to overlap with at least the channel region of the active layer 7 with a gate insulating layer 9 therebetween; a source electrode 15s electrically connected to the first region 7S; and a drain electrode 15d electrically connected to the second region 7D, at least the channel region 7C of the active layer 7 having a layered structure that includes a first metal layer m1 arranged on a lower oxide semiconductor layer 71 and containing substantially no oxygen, and an upper oxide semiconductor layer 72 arranged on the first metal layer m1, wherein a thickness of the first metal layer m1 is smaller than a thickness of the lower oxide semiconductor layer 71 or the upper oxide semiconductor 72.

16 Claims, 5 Drawing Sheets

(51) Int. Cl.
*H01L 29/66* (2006.01)
*H01L 29/10* (2006.01)
*H01L 29/78* (2006.01)

(52) U.S. Cl.
CPC .......... *H01L 29/1054* (2013.01); *H01L 29/78* (2013.01); *H01L 29/7869* (2013.01)

(58) Field of Classification Search
CPC ............. H01L 29/15–158; H01L 29/78; H01L 29/1054
See application file for complete search history.

(56) References Cited

U.S. PATENT DOCUMENTS

| | | | |
|---|---|---|---|
| 2010/0105164 A1* | 4/2010 | Ito | H01L 27/1214 257/E21.414 |
| 2011/0127523 A1* | 6/2011 | Yamazaki | H01L 29/221 257/E29.296 |
| 2011/0147706 A1* | 6/2011 | Radosavljevic | H01L 29/7783 257/E21.403 |
| 2011/0180793 A1* | 7/2011 | Taniguchi | H01L 29/66969 257/E21.409 |
| 2011/0215328 A1 | 9/2011 | Morosawa et al. | |
| 2011/0315936 A1 | 12/2011 | Inoue et al. | |
| 2012/0112045 A1 | 5/2012 | Tsubuku et al. | |
| 2014/0001465 A1* | 1/2014 | Yamazaki | H01L 29/24 257/43 |
| 2016/0149046 A1* | 5/2016 | Hanada | H01L 21/467 257/43 |
| 2017/0162818 A1 | 6/2017 | Kijima | |
| 2019/0280126 A1* | 9/2019 | Kikuchi | H01L 29/78696 |
| 2020/0227561 A1* | 7/2020 | Yamazaki | H01L 29/24 |

FOREIGN PATENT DOCUMENTS

| | | |
|---|---|---|
| JP | 2012-516053 A | 7/2012 |
| JP | 2013-105814 A | 5/2013 |
| JP | 2013-191850 A | 9/2013 |
| JP | 2014-030001 A | 2/2014 |
| JP | 2014-175360 A | 9/2014 |
| JP | 6275294 B2 | 2/2018 |
| WO | 2004/107303 A1 | 12/2004 |
| WO | 2016/035413 A1 | 3/2016 |
| WO | 2017/033082 A1 | 3/2017 |

\* cited by examiner (a)

(b)

THIN FILM TRANSISTOR AND MANUFACTURING METHOD OF SAME, AND DISPLAY DEVICE

TECHNICAL FIELD

The present invention relates to a thin film transistor, a method for manufacturing the same, and a display device.

BACKGROUND ART

Active matrix substrates are used in display devices such as liquid display devices, organic EL (Electro Luminescence) display devices and micro-LED (Light Emitting Diode) display devices, for example. A micro-LED display device is a display device that includes a plurality of light emitting diodes (LEDs) made of an inorganic compound and arranged in a two-dimensional arrangement.

A circuit (referred to as a "pixel circuit") including a thin film transistor (hereinafter, "TFT") is arranged in each pixel of an active matrix substrate.

A TFT (hereinafter referred to as an "oxide semiconductor TFT") using an oxide semiconductor such as an In—Ga—Zn—O-based semiconductor may be used as a TFT used in a pixel circuit (hereinafter, a "pixel circuit TFT"). For example, Patent Document No. 1 discloses oxide semiconductor TFTs of the top-gate structure and the bottom-gate structure. An oxide semiconductor TFT has a good sub-threshold characteristic and an excellent OFF characteristic (i.e., a small off-leak current).

CITATION LIST

Patent Literature

Patent Document No. 1: Japanese Laid-Open Patent Publication No. 2011-187506

SUMMARY OF INVENTION

Technical Problem

In current-driven display devices such as micro-LED display devices and organic EL display devices, for example, light-emitting elements (LEDs, organic EL devices, etc.) whose luminous intensity changes in accordance with the current are arranged so as to correspond to pixels. The current to be supplied to the light-emitting element of each pixel is controlled by the pixel circuit. Therefore, in order to realize a high brightness, it is preferred that TFTs having a high channel mobility (current driving force) are used as pixel circuit TFTs. In the present specification, the mobility of a portion of the active layer of the TFT that is to be the channel is referred to as the "channel mobility", as distinguished from the mobility of the material of the active layer itself (physical property).

Also with a display device of a voltage-driven type such as a liquid display device, TFTs of peripheral circuits, for example, are required to have a high channel mobility.

With a conventional oxide semiconductor TFT, however, it may not be possible to realize a sufficient channel mobility due to the physical property of an oxide semiconductor. Particularly, with an oxide semiconductor TFT having the top-gate structure, reducing the overlap length between the gate and the source/drain for the purpose of reducing the parasitic capacitance will further lower the channel mobility.

One embodiment of the present invention, which has been made in view of the above, has an object to provide an oxide semiconductor TFT, with which the channel mobility can be increased and a method for manufacturing the same, and a display device including such oxide semiconductor TFTs.

Solution to Problem

[Item 1]

A thin film transistor including:
  a substrate;
  an active layer supported on the substrate, the active layer including a first region, a second region, and a channel region located between the first region and the second region;
  a gate electrode arranged so as to overlap at least the channel region of the active layer with a gate insulating layer therebetween;
  a source electrode electrically connected to the first region of the active layer; and
  a drain electrode electrically connected to the second region of the active layer,
  at least the channel region of the active layer having a layered structure including:
    a lower oxide semiconductor layer;
    a first metal layer arranged on the lower oxide semiconductor layer and containing substantially no oxygen; and
    an upper oxide semiconductor layer arranged on the first metal layer,
  wherein a thickness of the first metal layer is smaller than a thickness of the lower oxide semiconductor layer or the upper oxide semiconductor layer.

[Item 2]

The thin film transistor according to Item 1, wherein the lower oxide semiconductor layer, the upper oxide semiconductor layer and the first metal layer include at least one common metal element.

[Item 3]

The thin film transistor according to Item 1 or 2, wherein the lower oxide semiconductor layer and/or the upper oxide semiconductor layer include an i-type semiconductor layer containing substantially no n-type impurity.

[Item 4]

The thin film transistor according to Item 1 or 2, wherein the lower oxide semiconductor layer and/or the upper oxide semiconductor layer further include:
  an i-type semiconductor layer containing substantially no n-type impurity; and
  an impurity-containing semiconductor layer arranged between the i-type semiconductor layer and the first metal layer and containing an n-type impurity.

[Item 5]

The thin film transistor according to any one of Items 1 to 4, wherein at least one of the lower oxide semiconductor layer and the upper oxide semiconductor layer contains an n-type impurity, and an n-type impurity concentration profile in a thickness direction of the at least one oxide semiconductor layer includes a gradient region where the concentration decreases away from the first metal layer.

[Item 6]

The thin film transistor according to any one of Items 1 to 5, wherein an oxygen concentration profile in a thickness direction of the lower oxide semiconductor layer and/or the upper oxide semiconductor layer includes a gradient region where the concentration increases away from the first metal layer.

[Item 7]

The thin film transistor according to any one of Items 1 to 6, wherein:
the layered structure includes at least one other metal layer between the lower oxide semiconductor layer and the first metal layer, wherein the first metal layer and the at least one other metal layer are stacked on each other with a middle oxide semiconductor layer therebetween; and
a thickness of the at least one other metal layer is smaller than a thickness of the lower oxide semiconductor layer or the upper oxide semiconductor layer.

[Item 8]

The thin film transistor according to any one of Items 1 to 7, wherein
the active layer is arranged between the substrate and the gate electrode;
the gate electrode overlaps with the channel region of the active layer and does not overlap with the first region and the second region, as viewed from a direction normal to the substrate; and
upper surfaces of the first region and the second region include low-resistance oxide semiconductor regions, which have a lower specific resistance than an upper surface of the channel region.

[Item 9]

The thin film transistor according to Item 8, wherein
the thin film transistor further includes an upper insulating layer that covers the active layer, the gate insulating layer and the gate electrode; and
the source electrode is electrically connected to the low-resistance oxide semiconductor region of the first region in a first opening formed in the upper insulating layer, and the drain electrode is electrically connected to the low-resistance oxide semiconductor region of the second region in a second opening formed in the upper insulating layer.

[Item 10]

The thin film transistor according to Item 8 or 9, wherein:
the active layer includes a lower layer that includes at least a portion of the lower oxide semiconductor layer, and an upper layer that is arranged on a portion of the lower layer and includes the upper oxide semiconductor layer and the first metal layer;
the channel region includes the upper layer and the lower layer; and
each of the first region and the second region includes the lower layer and does not include the upper layer.

[Item 11]

The thin film transistor according to Item 10, wherein perimeters of the gate electrode, the gate insulating layer and the upper layer of the active layer are aligned with each other, as viewed from a direction normal to the substrate.

[Item 12]

The thin film transistor according to any one of Items 8 to 11, wherein a thickness of the upper oxide semiconductor layer is greater than a thickness of the lower oxide semiconductor layer.

[Item 13]

The thin film transistor according to any one of Items 1 to 12, wherein the first metal layer contains a plurality of metal elements.

[Item 14]

The thin film transistor according to Item 13, wherein each of the lower oxide semiconductor layer, the upper oxide semiconductor layer and the first metal layer contains In, Ga and Zn.

[Item 15]

A display device including:
a thin film transistor according to any one of Items 1 to 14;
a display area including a plurality of pixels; and
pixel circuits arranged so as to correspond respectively to the plurality of pixels,
wherein the pixel circuits each include the thin film transistor.

[Item 16]

The display device according to Item 15, wherein the display device further includes current-driven light-emitting elements arranged so as to correspond respectively to the plurality of pixels, and the pixel circuits drive the light-emitting elements.

[Item 17]

A method for manufacturing a thin film transistor supported on a substrate, the method including:
a step (A) of forming an active layer having a layered structure on the substrate, the layered structure including a lower oxide semiconductor layer, a first metal layer containing substantially no oxygen, and an upper oxide semiconductor layer in this order,
wherein the step (A) includes:
a step of forming a first oxide semiconductor film to be the lower oxide semiconductor layer by a sputtering method in an atmosphere containing oxygen;
a step of forming a metal film to be the first metal layer by a sputtering method in an atmosphere containing an inert gas and no oxygen; and
a step of forming a second oxide semiconductor film to be the upper oxide semiconductor layer by a sputtering method in an atmosphere containing oxygen.

[Item 18]

The method according to Item 17, wherein the first oxide semiconductor film, the metal film and the second oxide semiconductor film are formed by using a common sputtering target containing no oxygen.

[Item 19]

The method according to Item 17 or 18, wherein
the method further includes a step (B) of forming a gate electrode on a portion of the active layer with a gate insulating layer therebetween,
wherein the step (B) includes:
a step (B1) of forming an insulating film and a gate conductive film in this order on the active layer;
a step (B2) of patterning the gate conductive film using a first mask, thereby forming the gate electrode; and
a step (B3) of, after the step (B2), patterning the insulating film using the first mask or using the gate electrode as a mask, thereby obtaining the gate insulating layer.

[Item 20]

The method according to Item 19, wherein the step (B) includes a step (B4) of, after the step (B3), etching the active layer using the first mask or using the gate electrode as a mask, thereby removing a portion of an upper layer of the active layer that includes at least the upper oxide semiconductor layer and the first metal layer and exposing a portion of a lower layer of the active layer that includes at least a portion of the lower oxide semiconductor layer.

Advantageous Effects of Invention

One embodiment of the present invention provides an oxide semiconductor TFT, with which the channel mobility can be increased and a method for manufacturing the same, and a display device including such oxide semiconductor TFTs.

DESCRIPTION OF EMBODIMENTS

Embodiments

A thin film transistor (TFT) according to an embodiment of the present invention will now be described with reference to the drawings.

A thin film transistor of the present embodiment is an oxide semiconductor TFT using an oxide semiconductor in the active layer. Here, an oxide semiconductor TFT having the top-gate structure will be described as an example.

Figure 1:
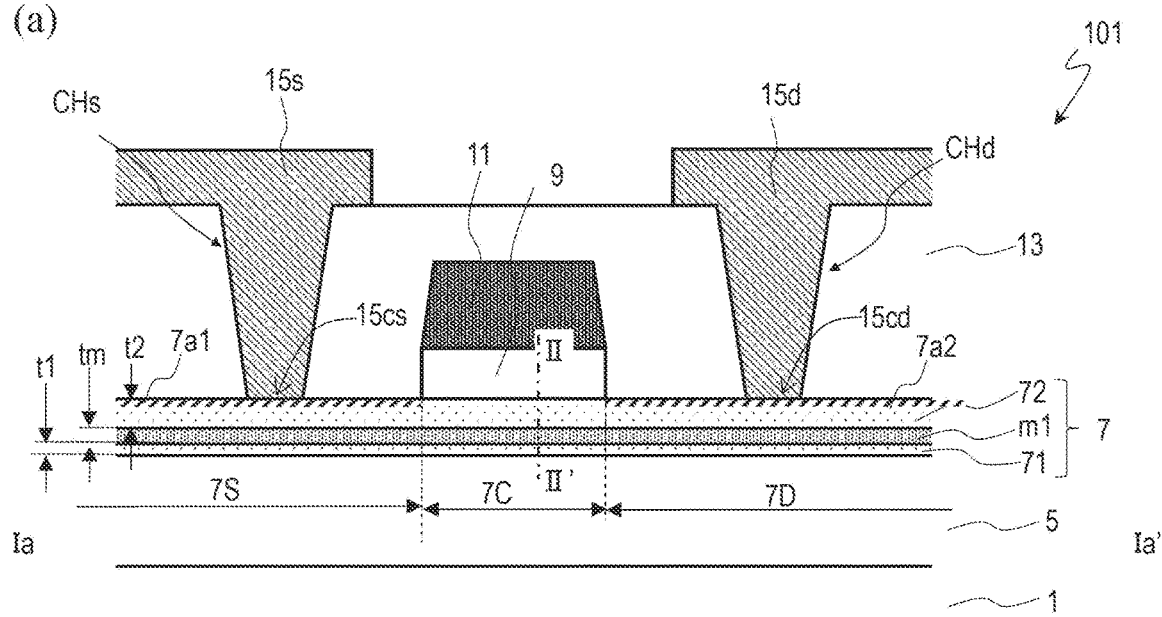
FIGS. 1(a) and 1(b) are a schematic cross-sectional view and a plan view, respectively, showing a TFT 101 according to an embodiment of the present invention.
Figure 1:
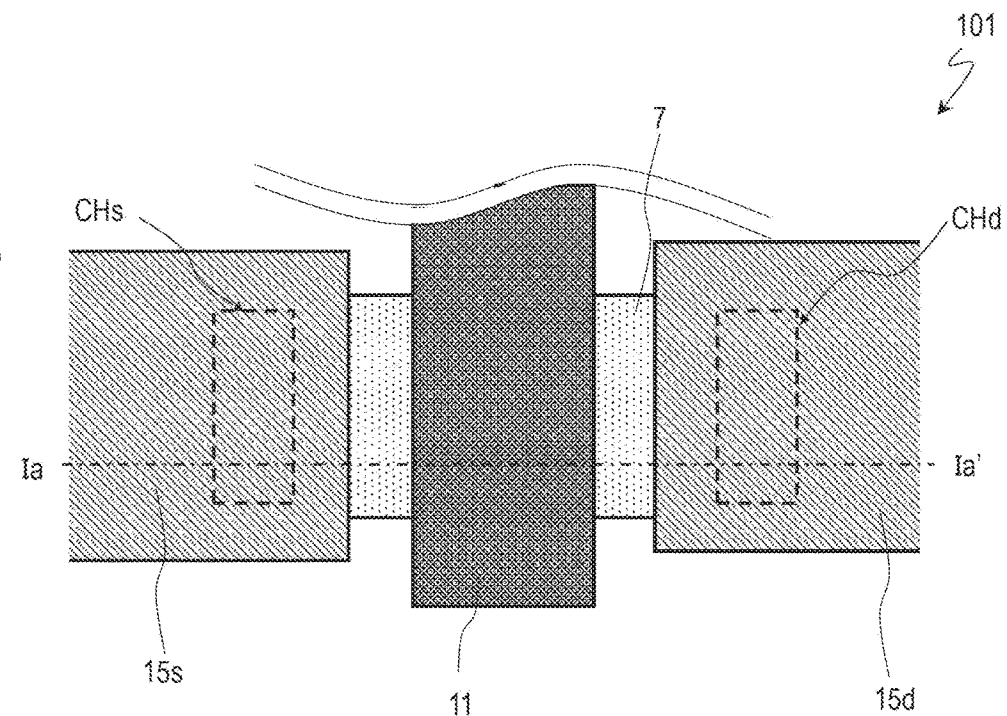

FIGS. 1(a) and 1(b) are a cross-sectional view and a plan view, respectively, illustrating a TFT 101 of the present embodiment. FIG. 1(a) shows a cross section taken along line Ia-Ia' shown in FIG. 1(b).

The TFT 101 includes a substrate 1 such as a glass substrate, an active layer 7 supported on the substrate 1, a gate electrode 11, a gate insulating layer 9 arranged between the active layer 7 and the gate electrode 11, and a source electrode 15a and a drain electrode 15d electrically connected to the active layer 7. In this example, the gate electrode 11 is arranged on a portion of the active layer 7 with the gate insulating layer 9 therebetween (a top-gate structure). A lower insulating layer 5 may be formed, as a base film, between the active layer 7 and the substrate 1.

The active layer 7 includes a first region 7S, a second region 7D, and a region (a channel region) 7C where the channel of the TFT 101 is formed located between the first region 78 and the second region 7D, as viewed from the direction normal to the substrate 1. At least the channel region 7C of the active layer 7 overlaps with the gate electrode 11, as viewed from the direction normal to the substrate 1.

The active layer 7 of the present embodiment has a layered structure at least including two oxide semiconductor layers 71 and 72 and a metal layer m1 located therebetween. The layered structure of the active layer 7 will be described later.

A first low-resistance region 7a1 and a second low-resistance region 7a2 (which may be referred to as the "first low-resistance oxide semiconductor region" and the "second low-resistance oxide semiconductor region"), which have a lower resistance than the surface of the channel region 7C, are formed respectively on the surfaces of the first region 73 and the second region 7D of the active layer 7. The first region 73 (here, the first low-resistance region 7a1 of the first region 7S) is electrically connected to the source electrode 15s. The second region 7D (here, the second low-resistance region 7a2 of the second region 7D) is electrically connected to the drain electrode 15d. A region 15cs of the surface of the first region 7S that is connected to the source electrode 15s is referred to as the "source contact region", and a region 15cd of the surface of the second region 7D that is connected to the drain electrode 15d is referred to as the "drain contact region".

The gate insulating layer 9 may be formed only between the active layer 7 and the gate electrode 11. The gate insulating layer 9 and the gate electrode 11 may be patterned using the same mask, for example.

An upper insulating layer 13 may be formed so as to cover the active layer 7, the gate insulating layer 9 and the gate electrode 11. The upper insulating layer 13 has a first opening CHs that reaches the first region 73 and a second opening CHd that reaches the second region 7D. The source electrode 15s is formed on the upper insulating layer 13 and in the first opening CHs, and is electrically connected to the first region 73 of the active layer 7 (here, the first low-resistance region 7a1) in the first opening CHs. The drain electrode 15d is formed on the upper insulating layer 13 and in the second opening CHd, and is electrically connected to the second region 7D of the active layer 7 (here, the second low-resistance region 7a2) in the second opening CHd.

<Structure of Active Layer 7>

In the TFT 101, the active layer 7 has a layered structure that includes the lower oxide semiconductor layer 71, the first metal layer m1 and the upper oxide semiconductor layer 72 in this order from the substrate 1 side.

The first metal layer m1 is a metal layer that contains substantially no oxygen (i.e., contains substantially no metal oxide). The first metal layer m1 may contain a plurality of metal elements. By containing the first metal layer m1, it is possible to realize a higher channel mobility than an active layer that is made only of an oxide semiconductor.

The thickness of the first metal layer m1 is smaller than the thickness of at least one of the lower oxide semiconductor layer 71 and the upper oxide semiconductor layer 72, for example. With such a configuration, it is possible to make the first metal layer m1 function as a carrier transfer layer (a layer in which carriers primarily move) in the active layer 7 while suppressing conduction between the source and the drain via the first metal layer m1.

The lower oxide semiconductor layer 71 may be the lowermost layer (the layer located farthest on the substrate 1 side) of the active layer 7. The upper oxide semiconductor layer 72 is the uppermost layer of the active layer 7 and may be in contact with the gate insulating layer 9. In the illustrated example, the active layer 7 has a three-layer structure, and the first metal layer m1 is arranged so as to be in contact with both the lower oxide semiconductor layer 71 and the upper oxide semiconductor layer 72. For example, the lower oxide semiconductor layer 71 and the upper oxide semiconductor layer 72 may be both an In—Ga—Zn—O-based semiconductor layer, and the first metal layer m1 may be a metal layer containing In, Ga and Zn. Note that the active layer 7 may have a layered structure having four layers or more, as will be described later.

Figure 9:
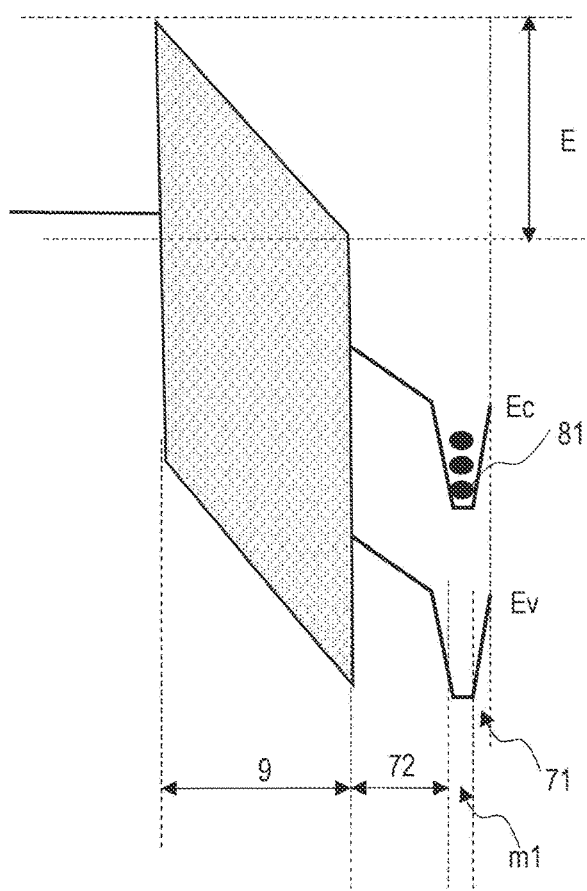
FIG. 9 is a schematic diagram illustrating an energy band structure of an active layer 7.

FIG. 9 is a schematic diagram illustrating the energy band structure of the channel region 7C on a cross section taken along line II-II' shown in FIG. 1(a).

In this example, the channel region 7C has a three-layer structure in which the first metal layer m1 is sandwiched between the lower oxide semiconductor layer 71 and the upper oxide semiconductor layer 72.

As shown in FIG. 9, in the channel region 7C, a quantum well is formed in the first metal layer a1, and electrons 81 accumulate at a high concentration in the quantum well. Thus, a region where electrons are present at a high concentration (a high-concentration electron region) is formed in the active layer 7, and this high-concentration electron region functions as a carrier transfer layer, thereby making it possible to increase the channel mobility of the TFT 101.

When the TFT 101 is OFF, the upper oxide semiconductor layer 72 is depleted, and it is therefore possible to suppress the OFF current to be low. Thus, it is possible to increase the channel mobility of the TFT 101 while maintaining a high OFF characteristic.

Moreover, the oxide semiconductor layer 71, 72 is arranged between the first metal layer m1, which is a carrier transfer layer, and an insulating film (such as the gate insulating layer 9 and the lower insulating layer 5) (a buried channel structure). Therefore, it is possible to suppress a decrease in channel mobility due to contamination with an impurity from the insulating film.

The lower oxide semiconductor layer 71 and the upper oxide semiconductor layer 72 may each be a single layer or may have a layered structure including a plurality of layers of different composition ratios. The lower oxide semiconductor layer 71 and the upper oxide semiconductor layer 72 may have a gradient region where the composition ratio changes in the thickness direction.

In the present embodiment, there is no limitation as long as at least the channel region 7C of the active layer 7 has a layered structure including the lower oxide semiconductor layer 71, the first metal layer m1 and the upper oxide semiconductor layer 72. Although the first region 78 and the second region 7D of the active layer 7 have a layered structure similar to the channel region 7C in this example, the first region 78 and the second region 7D may be made only of a lower layer (e.g., only the lower oxide semiconductor layer 71) of the layered structure of the channel region 7C, as will be described later.

If the source electrode 15s and the drain electrode 15d are connected directly to a metal layer such as the first metal layer m1, there may occur conduction between the source and the drain. Therefore, it is preferred that the source electrode 15s and the drain electrode 15d are not in contact with a metal layer such as the first metal layer m1 in the active layer 7.

The lower oxide semiconductor layer 71, the upper oxide semiconductor layer 72 and the first metal layer m1 may include at least one common metal element. For example, the lower oxide semiconductor layer 71 and the upper oxide semiconductor layer 72 may include an oxide semiconductor of the same composition, and the first metal layer m1 may be made only of a metal element of the oxide semiconductor.

The lower oxide semiconductor layer 71 and the upper oxide semiconductor layer 72 may each include an oxide semiconductor layer that contains substantially no n-type impurity (e.g., the n-type impurity concentration is less than or equal to the limit of measurement by SIMS (e.g., $1 \times 10^{17}$ atoms/cm$^3$ or less, depending on the apparatus)). In the present specification, an oxide semiconductor layer that contains substantially no n-type impurity (i.e., a non-doped oxide semiconductor layer that is formed without actively adding an n-type impurity thereto) is referred to as an "i-type semiconductor layer".

The lower oxide semiconductor layer 71 and the upper oxide semiconductor layer 72 may each be an i-type semiconductor layer or may have a layered structure including an i-type semiconductor layer. If at least one, or preferably both, of the lower oxide semiconductor layer 71 and the upper oxide semiconductor layer 72 includes an i-type semiconductor layer, it is possible to more reliably realize the effect (improving the channel mobility) of the high-concentration electron region shown in FIG. 9 while maintaining the OFF characteristic of the TFT 101.

Each oxide semiconductor layer included in the active layer 7 is not limited to an In—Ga—Zn—O-based semiconductor, but may include any of various oxide semiconductors. The oxide semiconductor may be non-crystalline or crystalline. The crystalline oxide semiconductor may be, for example, a poly-crystalline oxide semiconductor, a micro-crystalline oxide semiconductor, a crystalline oxide semiconductor whose c-axis is oriented generally perpendicular to the layer surface, or the like. Materials, compositions, structures, deposition methods, etc., of non-crystalline or crystalline oxide semiconductors are described in Japanese Patent No. 6275294, for example. The disclosure of Japanese Patent No. 6275294 is herein incorporated by reference.

The thicknesses t1 and t2 of the oxide semiconductor layers 71 and 72 of the active layer 7 may be 10 nm or more and 100 nm or less, for example. If 10 nm or more, it is possible to suppress diffusion of an impurity such as silicon from the insulating film into the first metal layer m1. The thickness t1 of the lower oxide semiconductor layer 71 may be smaller than the thickness t2 of the upper oxide semiconductor layer 72 (see FIG. 9).

Of the oxide semiconductor layers included in the active layer 7, the thickness of an oxide semiconductor layer that is located on the gate insulating layer 9 side of the metal layer (here, the first metal layer m1) to be the carrier transfer layer may be greater than the thickness of the oxide semiconductor layer that is located on the opposite side from the gate insulating layer 9 and the thickness tm of the first metal layer m1. That is, with the TFT 101 (a top-gate structure TFT), the thickness t2 of the upper oxide semiconductor layer 72 may be greater than the thickness t1 of the lower oxide semiconductor layer 71 and the thickness ta of the first metal layer m1. Thus, it is possible to realize a desired mobility, irrespective of the damage to the surface of the active layer 7, the thickness of the low-resistance region, etc.

Since the upper oxide semiconductor layer 72 is located between the first metal layer m1 and the drain contact region 15cd in the illustrated example, it is possible to realize a high OFF characteristic by setting the thickness t2 of the upper oxide semiconductor layer 72 to be greater than the thickness t1 of the lower oxide semiconductor layer 71 and the thickness ta of the first metal layer m1.

The thickness ta of the first metal layer m1 may be 3 nm or more and 10 nm or less, for example. If 3 nm or more, it is possible to more effectively improve the channel mobility. If 10 nm or less, it is possible to more reliably suppress conduction between the source and the drain. Alternatively, the thickness tm of the first metal layer m1 may be ⅓ or less of the total thickness of the active layer 7.

With the TFT 101, it is preferred that the gate electrode 11 is arranged so as not to overlap with the source electrode 15s and the drain electrode 15d. Alternatively, it is preferred to suppress the overlap length between the gate electrode 11 and the source electrode 15s and the drain electrode 15d to be small. Thus, the parasitic capacitance can be reduced. Note that normally, if the overlap length between the gate electrode and the source and drain electrode is suppressed to be small, the channel mobility lowers, and it has been difficult to realize both a high channel mobility and a low parasitic capacitance. In contrast, in the present embodiment, by providing the first metal layer m1 between the oxide semiconductor layers 71 and 72 in the active layer 7, it is possible to increase the channel mobility. Therefore, it is possible to realize a TFT of a high channel mobility even when the parasitic capacitance is suppressed by reducing (or eliminating) the overlap length.

Although not shown in the figures, a light-blocking layer may be further provided on the substrate 1 side of the active layer 7 (the channel region 7C). Note however that with a display device that does not need a backlight, such as a micro-LED display device, there is no need to provide a light-blocking layer. Alternatively, another gate electrode may be provided on the substrate 1 side of the active layer 7 with another gate insulating layer therebetween (a double-gate structure). The other gate electrode may be connected to the gate electrode 11. Note that although the other gate electrode may be connected to a fixed potential, when the other gate electrode is connected to a fixed potential, the ON current is saturated due to the parasitic bipolar effect, and the effect of the present embodiment (the effect of increasing the ON current) may be decreased.

<Method for Manufacturing TFT 101>

Referring again to FIG. 1(a) and FIG. 1(b), an example of a method for manufacturing the TFT 101 will now be described.

STEP 1: Formation of Lower Insulating Layer

First, the lower insulating layer 5 is formed on the substrate 1. The substrate 1 may be a substrate having an insulative surface, such as a glass substrate, and a silicon substrate, a heat-resistant plastic substrate (a resin substrate), for example.

A silicon oxide ($SiO_2$) layer, a silicon nitride (SiNx) layer, a silicon oxide nitride (SiOxNy; x>y) layer, a silicon nitride oxide (SiNxOy; x>y) layer, or the like, may be used appropriately as the lower insulating layer 5. The lower insulating layer 5 may have a layered structure. Here, a layered film including a silicon nitride (SiNx) layer as the lower layer and a silicon oxide ($SiO_2$) layer as the upper layer is formed as the lower insulating layer 5 by using a CVD method, for example. If an oxide film such as a silicon oxide film is used as the lower insulating layer 5 (as its uppermost layer where the lower insulating layer 5 has a layered structure), oxidation defects occurring in the channel region 7C of the active layer 7 to be formed later can be reduced by the oxide film, and it is therefore possible to suppress lowering of the resistance of the channel region 7C. There is no particular limitation on the thickness of the lower insulating layer 5, but it may be 200 nm or more and 500 nm or less, for example.

STEP 2: Formation of Active Layer

Next, a first oxide semiconductor film to be the lower oxide semiconductor layer 71, a first metal film to be the first metal layer m1, and a second oxide semiconductor film to be the upper oxide semiconductor layer 72 are formed in this order on the lower insulating layer 5, thereby obtaining a layered film to be the active layer 7.

The layered film is formed by using a sputtering method, for example. The sputtering gas (atmosphere) may be a mixed gas of an inert gas such as an argon gas and an oxidizing gas such as $O_2$, $CO_2$, $O_3$, $H_2O$ or $N_2O$. The formation conditions such as the sputtering target to be used and the mixing ratio of the sputtering gas (the ratio of oxygen gas to inert gas) can be selected appropriately in accordance with the composition (or the composition ratio) of the oxide semiconductor film and the metal film to be formed.

Specifically, first, using a mixed gas containing an Ar gas and an oxygen gas as the sputtering gas, a first oxide semiconductor film (thickness: 30 nm, for example) is formed by a sputtering method in an oxygen-containing atmosphere. Next, using an inert gas as the sputtering gas, a first metal film (thickness: 10 nm, for example) is formed by a sputtering method in an atmosphere containing an inert gas and substantially no oxygen. Then, using the mixed gas described above as the sputtering gas, a second oxide semiconductor film (thickness: 60 nm, for example) is formed by a sputtering method in an oxygen-containing atmosphere.

Where oxide semiconductor films and metal films included in the layered film contain a common metal element, these films can be formed by using a common sputtering target that contains the common metal element and contains no oxygen. For example, a film primarily containing an In—Ga—Zn—O-based semiconductor (In:Ga:Zn=1:1:1) as the first oxide semiconductor film, a metal film (In:Ga:Zn=1:1:1) containing In, Ga and Zn as the first metal film, and a film primarily containing an In—Ga—Zn—C-based semiconductor (In:Ga:Zn=1:1:1) as the second oxide semiconductor film may be formed using a target having a predetermined composition (In:Ga:Zn=1:1:1).

Thereafter, the layered film to be the active layer may be subjected to a heat treatment. Here, a heat treatment is performed in an atmospheric atmosphere at a temperature of 300° C. or more and 500° C. or less. The heat treatment time is 30 minutes or more and 2 hours or less, for example.

Then, the layered film is patterned, thereby obtaining the active layer 7 having a layered structure. The patterning of the layered film may be performed by wet etching, for example. The first oxide semiconductor film, the first metal film and the second oxide semiconductor film are to be the lower oxide semiconductor layer 71, the first metal layer m1 and the upper oxide semiconductor layer 72, respectively. There is no particular limitation on the total thickness of the active layer 7, but it may be 100 nm or more and 200 nm or less, for example.

STEP 3: Formation of Gate Insulating Layer and Gate Electrode

Then, an insulating film to be the gate insulating layer and a gate conductive film to be the gate electrode are formed in this order so as to cover the active layer 7. There is no particular limitation on the thickness of the insulating film, but it may be 200 nm or more and 500 nm or less, for example. There is no particular limitation on the thickness of the gate conductive film, but it may be 200 nm or more and 500 nm or less, for example.

The insulating film to be the gate insulating layer can be formed by a CVD method, for example. A silicon oxide ($SiO_2$) film, a silicon nitride (SiNx) film, a silicon oxide nitride (SiOxNy; x>y) film, a silicon nitride oxide (SiNyOx; y>x) film, or a layered film thereof, or the like, may be used appropriately as the insulating film. When an oxide film such as a silicon oxide film is used as the insulating film (where a layered film is used, as the lowermost film thereof), it is possible to reduce oxidation defects occurring in the channel region 7C of the active layer 7, and it is therefore possible to suppress lowering of the resistance of the channel region 7C.

The gate conductive film can be formed by using a sputtering method, for example. The material of the gate conductive film may be, for example, a single metal such as molybdenum (Mo), tungsten (W), copper (Cu), chromium (Cr), tantalum (Ta), aluminum (Al) or titanium (Ti), a material obtained by adding nitrogen, oxygen or another metal thereto, or a transparent conductive material such as indium tin oxide (ITO).

Then, a first resist mask is formed over a portion of the gate conductive film. Thereafter, the gate conductive film is patterned using the first resist mask, thereby forming the gate electrode 11. The patterning of the gate conductive film can be performed by wet etching or dry etching.

Next, the insulating film is patterned using the first resist mask. Alternatively, after the first resist mask is removed, the insulating film may be patterned using the patterned gate electrode 11 as a mask. The patterning of the insulating film can be performed by dry etching, for example. Thus, the gate insulating layer 9 of the TFT 101 is obtained, and surfaces of portions of the active layer 7 that are to be the first region 7S and the second region 7D are exposed.

In this step, since the insulating film and the gate conductive film are patterned using the same mask (the first resist mask), the side surface of the gate insulating layer 9 and the side surface of the gate electrode 11 are aligned with each other in the thickness direction. That is, the perimeter of the gate insulating layer 9 and the perimeter of the gate electrode 11 are aligned with each other, as viewed from the direction normal to the substrate 1.

Note that by the dry etching described above, a surface portion of the active layer 7 (e.g., a surface portion of the upper oxide semiconductor layer 72) may also be etched as well as the insulating film.

STEP 4: Resistance Lowering Process

Then, a resistance lowering process is performed so as to lower the specific resistance of a portion of the active layer 7 that does not overlap with the gate electrode 11, as viewed from the direction normal to the substrate 1, to be lower than the specific resistance of a portion thereof that overlaps with the gate electrode 11, thus forming the low-resistance regions 7a1 and 7a2. Here, the resistance lowering process is performed on the surface on which the active layer 7 is exposed (the surfaces of the first region 7S and the second region 7D) using the gate electrode 11 as a mask. The plasma treatment, for example, may be performed as the resistance lowering process. Examples of the plasma treatment include an argon plasma treatment, an ammonia plasma treatment, a hydrogen plasma treatment, etc. Alternatively, the low-resistance regions 7a1 and 7a2 may be formed on the surfaces of the first region 7S and the second region 7D by adding nitrogen, phosphorus, etc., to the active layer 7 by an ion implantation method, or the like, using the gate electrode 11 as a mask.

Alternatively, by using an insulating film that reduces an oxide semiconductor such as a nitride film (e.g., a silicon nitride film) as the upper insulating layer 13, it is possible to lower the resistance of the regions of the active layer 7 that are in contact with the nitride film (the surfaces of the first region 7S and the second region 7D) to be lower than the resistance of a region of the active layer 7 that is in contact with the oxide film (the surface of the channel region 7C).

STEP 5: Formation of Upper Insulating Layer

Next, the upper insulating layer 13 that covers the gate electrode 11, the gate insulating layer 9 and the active layer 7 is formed. As the upper insulating layer 13, an inorganic insulating layer such as a silicon oxide film, a silicon nitride film, a silicon oxide nitride film or a silicon nitride oxide film may be formed to be a single layer or a layered structure. As described above, an insulating film that reduces an oxide semiconductor such as a silicon nitride film may be used as the upper insulating layer 13 (where the upper insulating layer 13 has a layered structure, as the lowermost layer thereof). Here, as the upper insulating layer 13, a silicon nitride layer is formed by a CVD method, for example. There is no particular limitation on the thickness of the upper insulating layer 13, but it may be 1000 nm or more and 1500 nm or less, for example.

Thereafter, the first opening CHs that reaches the surface of the first region 7S (the first low-resistance region 7a1) and the second opening CHd that reaches the surface of the second region 7D (the second low-resistance region 7a2) are formed in the upper insulating layer 13 by dry etching, for example.

STEP 6: Formation of Source and Drain Electrode

Then, a source conductive film is formed on the upper insulating layer 13 and in the first opening CHs and the second opening CHd, and the source conductive film is patterned. Thus, the source electrode 15s and the drain electrode 15d are formed from the source conductive film.

A material similar to the gate conductive film described above may be used as the material of the source conductive film. There is no particular limitation on the thickness of the source conductive film, but it may be 400 nm or more and 800 nm or less, for example. The patterning of the source conductive film can be performed by dry etching or wet etching. Thus, the TFT 101 is manufactured.

(Variation 1)

The lower oxide semiconductor layer 71 and/or the upper oxide semiconductor layer 72 may have a layered structure including an i-type semiconductor layer and an oxide semiconductor layer containing an n-type impurity (hereinafter referred to as the "impurity-containing semiconductor layer").

Figure 2:
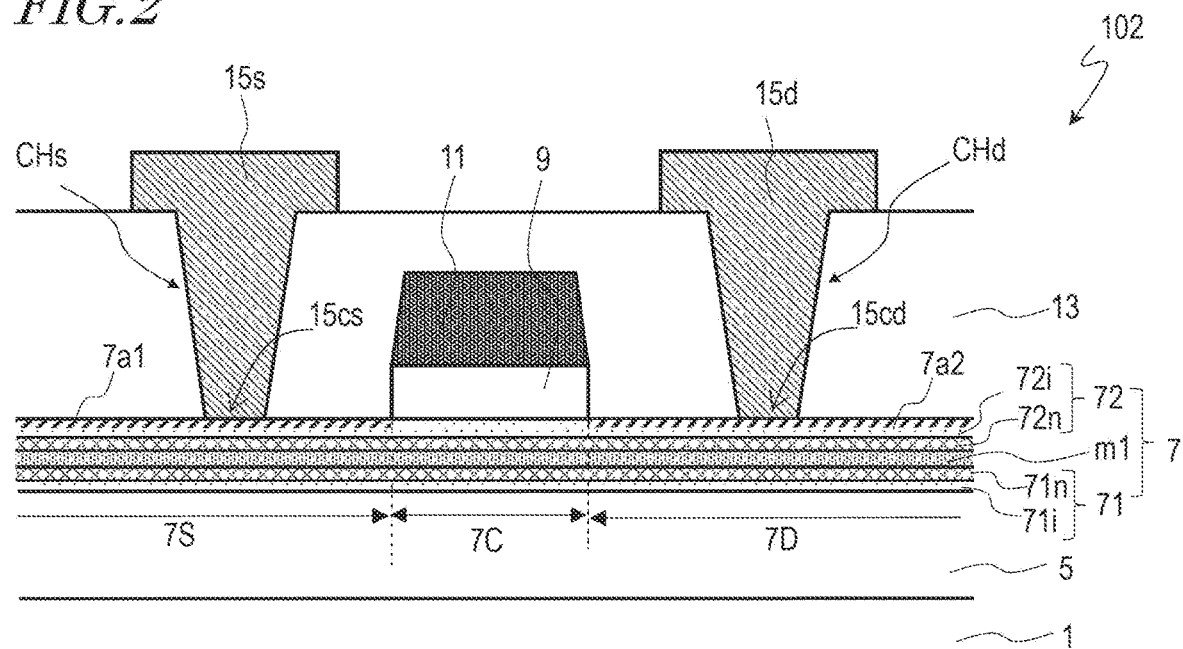
FIG. 2 is a cross-sectional view illustrating a TFT 102 of Variation 1.

FIG. 2 is a cross-sectional view illustrating another TFT 102 of the present embodiment.

The TFT 102 is different from the TFT 101 in that the lower oxide semiconductor layer 71 and the upper oxide semiconductor layer 72 has a layered structure.

In the TFT 102, the lower oxide semiconductor layer 71 includes an i-type semiconductor layer 71i and an impurity-containing semiconductor layer 71n, which is arranged between the i-type semiconductor layer 71i and the first metal layer m1 (i.e., on the i-type semiconductor layer 71i). The impurity-containing semiconductor layer 71n may be in direct contact with the first metal layer m1.

Similarly, the upper oxide semiconductor layer 72 includes an i-type semiconductor layer 72i, and the impurity-containing semiconductor layer 72n that is arranged between the i-type semiconductor layer 72i and the first metal layer m1 (i.e., on the substrate 1 side of the i-type semiconductor layer 72i). The impurity-containing semiconductor layer 72n may be in direct contact with the first metal layer m1.

The specific resistance of the impurity-containing semiconductor layers 71n and 72n is lower than the adjacent i-type semiconductor layers 71i and 72i. The oxygen concentration (the oxygen atomic number ratio) of the impurity-containing semiconductor layers 71n and 72n may be lower than the oxygen concentration of the adjacent i-type semiconductor layers 71i and 72i.

The thickness of the impurity-containing semiconductor layer 71n may be smaller than the thickness of the adjacent i-type semiconductor layer 71i. Similarly, the thickness of the impurity-containing semiconductor layer 72n may be smaller than the thickness of the adjacent i-type semiconductor layer 72i. By making the i-type semiconductor layers 71i and 72i thicker than the impurity-containing semiconductor layers 71n and 72n, it is possible to more reliably ensure a high OFF characteristic. Note that the thicknesses of the lower oxide semiconductor layer 71 and the upper oxide semiconductor layer 72 (the total thickness of the i-type semiconductor layer and the impurity-containing semiconductor layer) may be similar to the thicknesses of the lower oxide semiconductor layer 71 and the upper oxide semiconductor layer 72 of the TFT 101.

For example, phosphorus, arsenic, or the like, may be used as the n-type impurity contained in the impurity-containing semiconductor layers 71n and 72n. The concentration of the n-type impurity may be $1\times10^{18}$ atoms/cm$^3$ or more and $4\times10^{19}$ atoms/cm$^3$ or less, for example. Alternatively, the concentration of the n-type impurity may be adjusted so that the specific resistance of the n-type semiconductor layer is 500 Ωcm or more and 90000 Ωm or less, for example.

Figure 3:
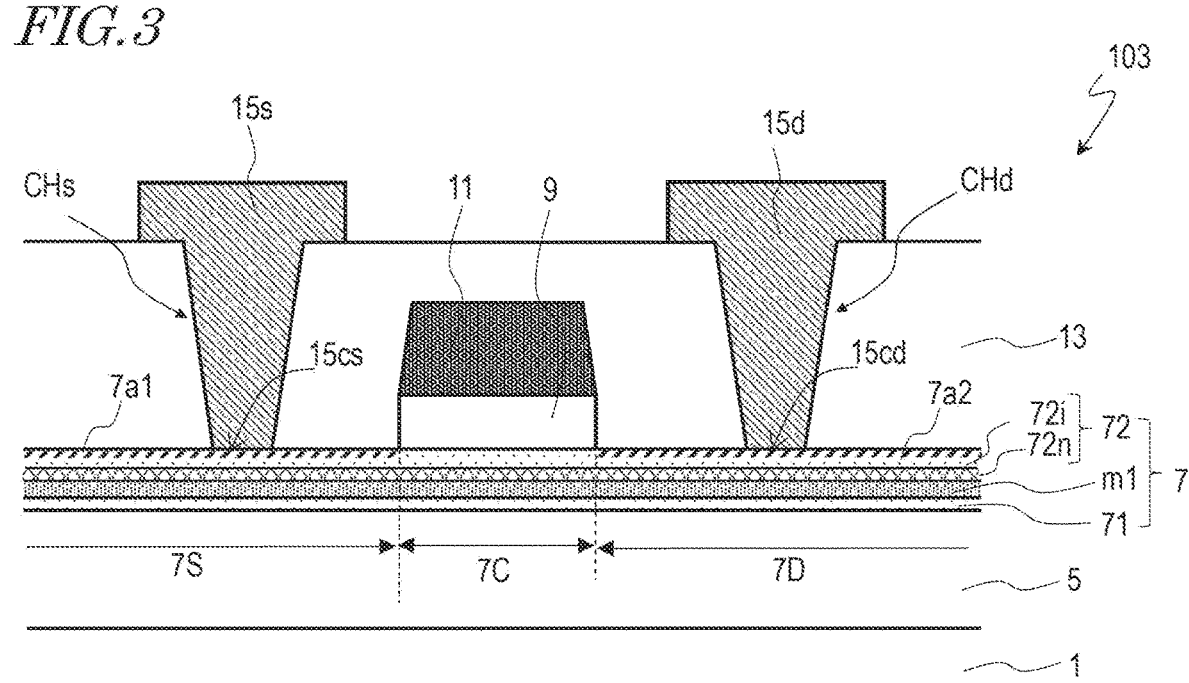
FIG. 3 is a cross-sectional view illustrating another TFT 103 of Variation 1.
Figure 4:
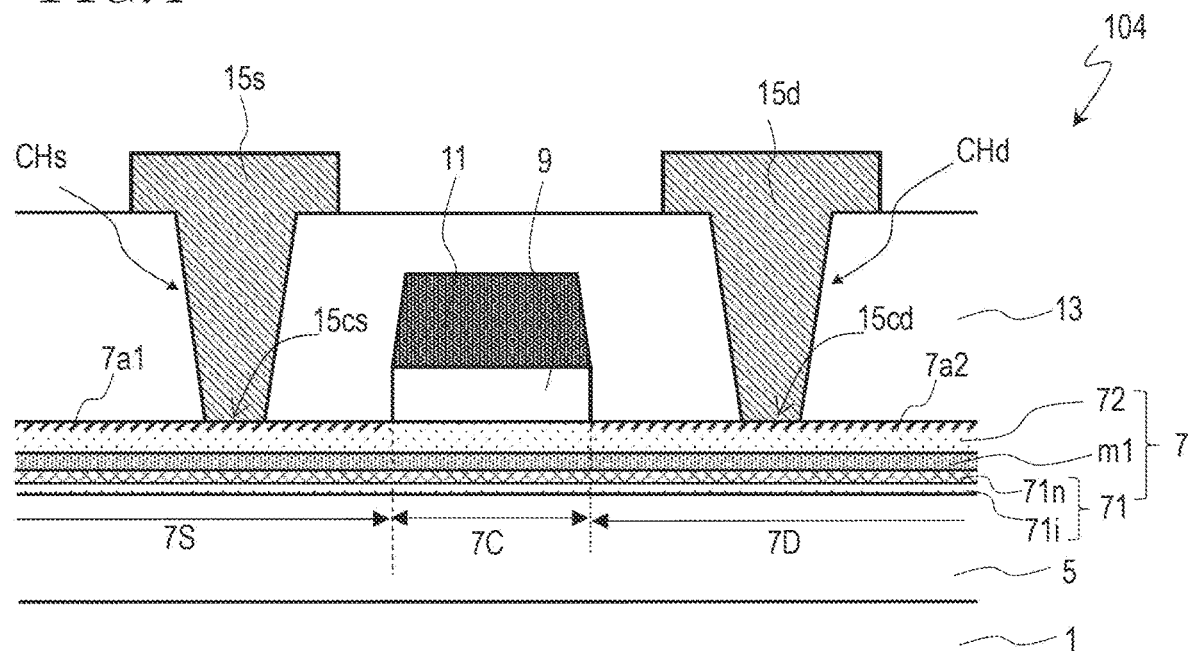
FIG. 4 is a cross-sectional view illustrating still another TFT 104 of Variation 1.

FIG. 3 and FIG. 4 are cross-sectional views respectively illustrating still other TFTs 103 and 104 of the present embodiment.

The TFT 103 is different from the TFTs 101 and 102 described above in that the lower oxide semiconductor layer 71 has a single-layer structure and the upper oxide semiconductor layer 72 has a layered structure. The lower oxide semiconductor layer 71 is an i-type semiconductor layer, for example. The upper oxide semiconductor layer 72 has a layered structure similar to the upper oxide semiconductor layer 72 of the TFT 102. That is, the impurity-containing semiconductor layer 72n is arranged between the i-type semiconductor layer 72i and the first metal layer m1.

The TFT 104 is different from the TFTs 101 and 102 described above in that the lower oxide semiconductor layer 71 has a layered structure, and the upper oxide semiconductor layer 72 has a single-layer structure. The lower oxide semiconductor layer 71 has a layered structure similar to the lower oxide semiconductor layer 71 of the TFT 102. That is, the impurity-containing semiconductor layer 71n is arranged between the i-type semiconductor layer 71i and the first metal layer m1. The upper oxide semiconductor layer 72 is an i-type semiconductor layer, for example.

Note that although not shown in the figures, a low-concentration impurity semiconductor layer that contains an n-type impurity at a lower concentration than the adjacent impurity-containing semiconductor layers 71n and 72n may be used instead of the i-type semiconductor layers 71i and 72i of the TFTs 102 to 104.

The TFT 102 to the TFT 104 can be manufactured by a method similar to the method for manufacturing the TFT 101 described above. Note however that in STEP 2, a layered film including an i-type oxide semiconductor film to be the i-type semiconductor layers 71i and 72i and an impurity-containing oxide semiconductor film to be the impurity-containing semiconductor layers 71n and 72n is formed as a layered film to be the active layer 7. An impurity-containing oxide semiconductor film containing nitrogen as an n-type impurity can be formed by using, as the sputtering gas, a mixed gas including a nitrogen-containing gas, for example, in addition to the inert gas and the oxidizing gas. An n-type oxide semiconductor film containing phosphorus as an n-type impurity can be formed by using a sputtering target containing a minute amount of phosphorus, for example.

(Variation 2)

The lower oxide semiconductor layer 71 and/or the upper oxide semiconductor layer 72 may include a gradient region where the n-type impurity or oxygen concentration changes in the thickness direction.

The n-type impurity concentration profile in the thickness direction of the lower oxide semiconductor layer 71 and/or the upper oxide semiconductor layer 72 may include a gradient region where the n-type impurity concentration decreases away from the first metal layer m1. The oxygen concentration profile in the thickness direction of the lower oxide semiconductor layer 71 and/or the upper oxide semiconductor layer 72 may include a gradient region where the oxygen concentration increases away from the first metal layer m1.

Note that there is no limitation as long as the concentration profile of the lower oxide semiconductor layer 71 and the upper oxide semiconductor layer 72 at least partially includes such a gradient region. For example, the lower oxide semiconductor layer 71 or the upper oxide semiconductor layer 72 may include a region where the n-type impurity concentration is generally constant (e.g., the i-type semiconductor layer), and a gradient region where the n-type impurity concentration changes.

The TFT of the present variation can be formed by a method similar to the method for manufacturing the TFT 101 described above. Note however that in STEP 2, when the first oxide semiconductor film or the second oxide semiconductor film is formed by a sputtering method, the ratio of oxygen gas to inert gas in the sputtering gas may be changed in a continuous or stepwise manner. Thus, there is obtained an oxide semiconductor film having a gradient region where the oxygen concentration changes. When the first oxide semiconductor film or the second oxide semiconductor film is formed by a sputtering method, the ratio of the nitrogen-containing gas added to the sputtering gas may be changed in a continuous or stepwise manner. Thus, there is obtained an oxide semiconductor film having a gradient region where the n-type impurity concentration (the nitrogen concentration) changes.

(Variation 3)

The first region 7S and the second region 7D of the active layer 7 may include only a portion of the layer that forms the channel region 7C. For example, the first region 7S and the second region 7D may be a single layer of the lower oxide semiconductor layer 71.

Figure 5:
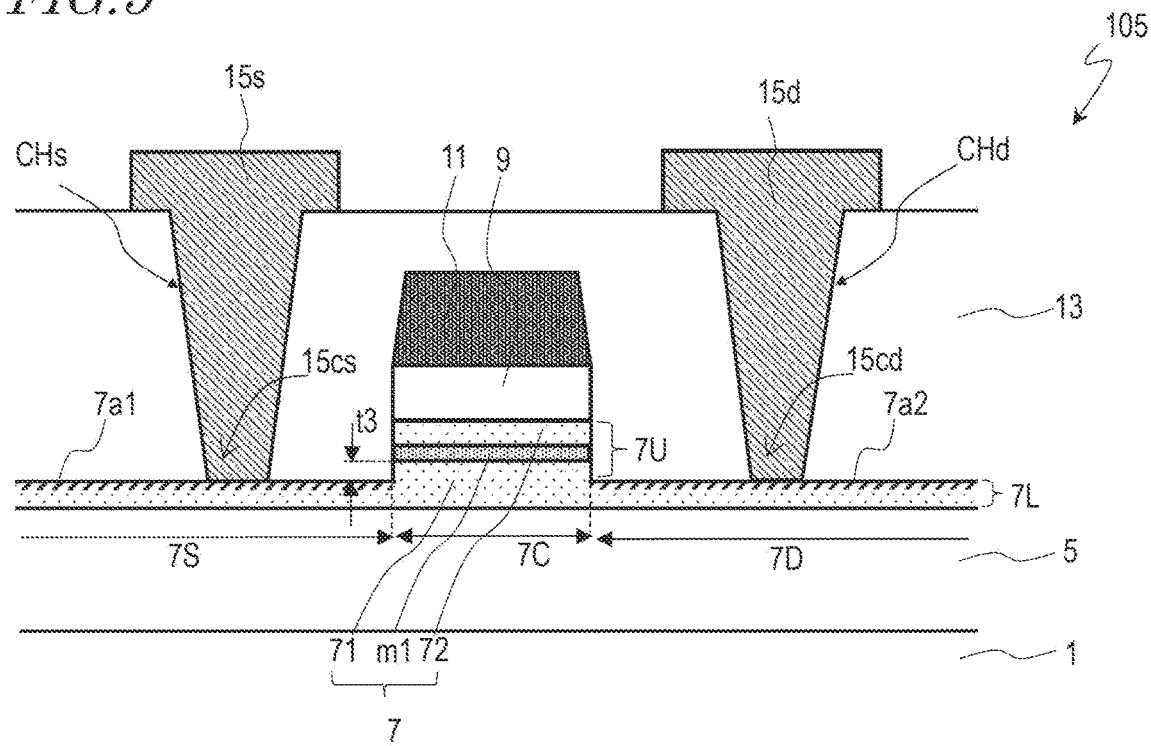
FIG. 5 is a cross-sectional view showing a TFT 105 of Variation 3.

FIG. 5 is a cross-sectional view illustrating still another TFT 105 of the present embodiment.

In the TFT 105, the active layer 7 includes a lower layer 7L that includes at least a portion of the lower oxide semiconductor layer 71, and an upper layer 7U that is arranged on a portion of the lower layer 7L and at least includes the upper oxide semiconductor layer 72 and the first metal layer m1. The channel region 7C includes the lower layer 7L and the upper layer 7U. Each of the first region 7S and the second region 7D includes the lower layer 7L but does not include the upper layer 7U. In this example, the upper layer 7U includes the upper oxide semiconductor layer 72, the first metal layer m1 and a portion (an upper portion) of the lower oxide semiconductor layer 71, and the lower layer 7L includes a portion (a lower portion) of the lower oxide semiconductor layer 71.

The surface of the lower layer 7L is the lower oxide semiconductor layer 71. The first low-resistance region 7a1 and the second low-resistance region 7a2 whose specific resistance is lower than a portion thereof located in the channel region 7C are formed in portions of the surface of the lower layer 7L that are located in the first region 7S and the second region 7D. The source electrode 15s and the drain electrode 15d are in contact with the first low-resistance region 7a1 and the second low-resistance region 7a2 in the first opening CHs and the second opening CHd, respectively.

If the first metal layer m1 is exposed on the surface of the lower layer 7L, the source electrode 15s and the drain electrode 15d may come into direct contact with the first metal layer m1, causing conduction between the source and the drain. In order to more reliably avoid this, it is preferred that the lower layer 7L does not include the first metal layer m1. More preferably, the thickness t3 of a portion of the lower oxide semiconductor layer 71 that is included in the upper layer 7U (i.e., the distance between the low-resistance regions 7a1 and 7a2 and the first metal layer m1) is 10 nm or more, for example.

The TFT 105 can be manufactured by a method similar to the method for manufacturing the TFT 101 described above. Note however that in STEP 3, it can be obtained by, after the patterning of the gate electrode 11 and the gate insulating layer 9, etching (e.g., dry etching) the upper layer 7U including the upper oxide semiconductor layer 72 by using the same mask or using the gate electrode 11 as a mask. Thus, a portion of the upper layer 70 that does not overlap with the gate electrode 11, as viewed from the direction normal to the substrate 1, is removed, thereby exposing the surface of the lower layer 7L. Thereafter, in STEP 4, a resistance lowering process may be performed on the exposed surface of the lower layer 7L (here, the surface of the lower oxide semiconductor layer 71), thereby forming the first low-resistance region 7a1 and the second low-resistance region 7a2 on the surface of the first region 7S and the second region 7D of the active layer 7.

(Variation 4)

The layered structure of the active layer 7 may include a plurality of metal layers functioning as carrier transfer layers between the lower oxide semiconductor layer 71 and the upper oxide semiconductor layer 72. The plurality of metal layers may be stacked on each other with oxide semiconductor layers therebetween.

Figure 6:
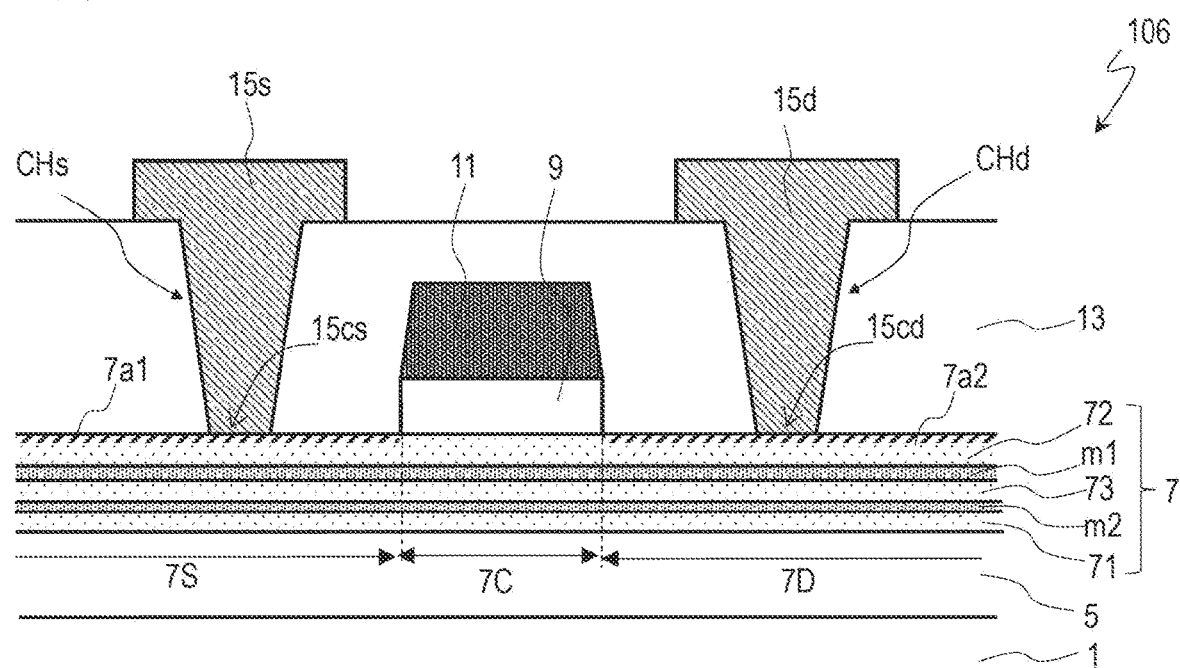
FIG. 6 is a cross-sectional view showing a TFT 106 of Variation 4.

FIG. 6 is a cross-sectional view illustrating another TFT 106 of the present embodiment.

In the TFT 106, the layered structure of the active layer 7 further includes a second metal layer m2 arranged between the first metal layer m1 and the lower oxide semiconductor layer 71, and a middle oxide semiconductor layer 73 arranged between the first metal layer m1 and the second metal layer m2. The first metal layer m1 may be in contact with the upper oxide semiconductor layer 72, which is the uppermost layer of the active layer 7. The upper oxide semiconductor layer 72 may be in contact with the gate insulating layer 9.

According to Variation 4, by providing two or more metal layers m1 and m2 that function as carrier transfer layers in the channel region 7C, it is possible to more effectively increase the channel mobility.

The middle oxide semiconductor layer 73 may be an i-type semiconductor layer that includes substantially no n-type impurity. Alternatively, the middle oxide semiconductor layer 73 may have a layered structure including an i-type semiconductor layer. For example, the middle oxide semiconductor layer 73 may include an i-type semiconductor layer and an impurity-containing semiconductor layer containing an n-type impurity, wherein the impurity-containing semiconductor layer is arranged between the i-type semiconductor layer and the first metal layer m1 and/or between the i-type semiconductor layer and the second metal layer m2. The n-type impurity concentration of the impurity-containing semiconductor layer may be similar to the concentration of the impurity-containing semiconductor layers 71n and 72n described above in Variation 1.

Although not shown in the figures, the middle oxide semiconductor layer 73 may include a gradient region where the oxygen concentration or the n-type impurity concentration changes in the thickness direction. For example, the n-type impurity concentration profile in the thickness direction of the middle oxide semiconductor layer 73 may include a gradient region where the concentration increases toward the first metal layer m1 and the second metal layer m2. The oxygen concentration profile in the thickness direction of the middle oxide semiconductor layer 73 may include a gradient region where the concentration is high in the vicinity of the center and decreases toward the first metal layer m1 and the second metal layer m2.

Figure 7:
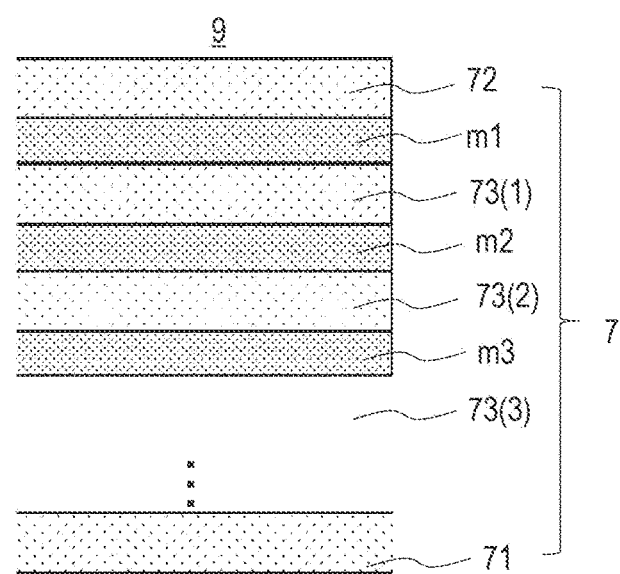
FIG. 7 is a cross-sectional view illustrating another active layer of the TFT of Variation 4.

Note that the active layer 7 may include three or more metal layers. For example, as illustrated in FIG. 7, the active layer 7 may include a plurality of metal layers m2, m3, ..., between the first metal layer m1 and the lower oxide semiconductor layer 71. The first metal layer m1 and the plurality of metal layers may be stacked on each other with middle oxide semiconductor layers 73(1), 73(2), ..., therebetween.

Each metal layer may have a similar material and thickness to those of the first metal layer m1 described above. Each middle oxide semiconductor layer may have a similar material and thickness to those of the lower oxide semiconductor layer 71 and the upper oxide semiconductor layer 72 described above. The thickness of each middle oxide semiconductor layer may be smaller than the thickness of the oxide semiconductor layer (here, the upper oxide semiconductor layer 72) located on the gate insulating layer 9 side of the first metal layer m1.

Also in the present variation, the source electrode 15s and the drain electrode 15d may be connected to a low-resistance region formed on the surface of the upper oxide semiconductor layer 72 as shown in FIG. 6.

The TFT 106 can be manufactured by a method similar to the method for manufacturing the TFT 101 described above. In STEP 2, a predetermined layered film may be formed as a film to be the active layer 7.

Figure 8:
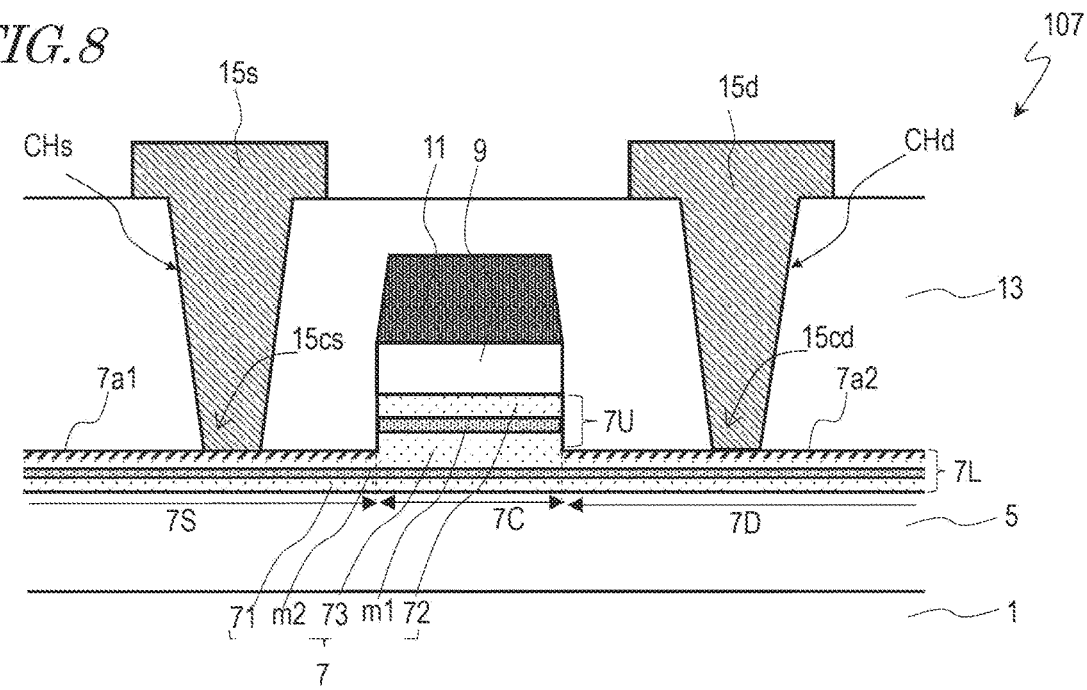
FIG. 8 is a cross-sectional view showing still another TFT 107 of Variation 4.

Note that as illustrated in FIG. 5, the first region 7S and the second region 7D may only include a partial layer (the lower layer 7L) of the channel region 7C. The source electrode 15s and the drain electrode 15d may be connected to a low-resistance region formed on the surface of the lower layer 7L. In such a case, the lower layer 7L may be formed of a part of the lower oxide semiconductor layer 71, for example, and the low-resistance region may be formed on the surface of the lower oxide semiconductor layer 71. Alternatively, the lower layer 7L may include the lower oxide semiconductor layer 71, and at least one metal layer and at least one middle oxide semiconductor layer. For example, as in a TFT 107 illustrated in FIG. 8, the lower layer 7L may include a part of the lower oxide semiconductor layer 71, the second metal layer m2 and the middle oxide semiconductor layer 73, and the low-resistance region may be formed on the surface of the middle oxide semiconductor layer 73.

The structure of the TFT of the present embodiment is not limited to the structure described above with reference to FIG. 1 to FIG. 8. While TFTs having a top-gate structure have been described above as an example, the TFT of the present embodiment may have a bottom-gate structure (a channel-etched type, an etch-stop type) where the gate electrode is arranged on the substrate side of the active layer. The structure of a bottom-gate structure TFT is disclosed in, for example, Japanese Laid-Open Patent Publication No. 2012-114428, Japanese Laid-Open Patent Publication No. 2011-187506, etc. The entire disclosures of these documents are herein incorporated by reference. While the source and drain electrode is in contact with the upper surface of the active layer (a top contact structure) in the description above, the soured and drain electrode may be arranged so as to be in contact with the lower surface of the active layer (a bottom contact structure).

The thin film transistor of the present embodiment is applicable to circuit substrates such as active matrix substrates, various display devices such as liquid display devices, organic EL display devices and micro-LED display devices, image sensors, electronic appliances, etc., for example.

An active matrix substrate and a display device using a thin film transistor of the present embodiment will now be described.

The active matrix substrate includes a display area including a plurality of pixels, and pixel circuits arranged so as to correspond respectively to the pixels. Each pixel circuit includes at least one thin film transistor (pixel circuit TFT) as a circuit element. Peripheral circuits such as driver circuits may be provided monolithically (integrally) in an area (a peripheral area) of the active matrix substrate other than the display area. A peripheral circuit includes at least one thin film transistor (a peripheral circuit TFT) as a circuit element. The thin film transistor of the present embodiment can be used as a pixel circuit TFT and/or a peripheral circuit TFT. Such an active matrix substrate is used not only in a voltage-driven display device such as a liquid display device but also in a current-driven display device.

Particularly, the thin film transistor of the present embodiment is suitably applicable to current-driven display devices. In a current-driven display device such as an organic EL display device or a micro-LED display device, a plurality of current-driven light-emitting elements (organic EL elements, LED elements, etc.) are arranged so as to correspond respectively to the pixels. Each pixel circuit (referred to also as "pixel driver circuit") drives the corresponding light-emitting element. The thin film transistor of the present embodiment, which can have a high channel mobility (current driving force), is suitably applicable to pixel driver circuits for driving current-driven light-emitting elements, thereby realizing an even higher brightness. Configurations of pixel driver circuits are disclosed in International Publication WO2016/035413 pamphlet, International Publication WO2004/107303 pamphlet, etc., for example. The entire disclosures of these documents are herein incorporated by reference.

INDUSTRIAL APPLICABILITY

Embodiments of the present invention are widely applicable to devices and electronic appliances having TFTs. For example, embodiments of the present invention are applicable to circuit substrates such as active matrix substrates, display devices such as liquid crystal display devices, organic EL display devices and micro-LED display devices, radiation detectors, imaging devices such as image sensors, electronic devices such as image input devices and fingerprint reader devices, etc.

REFERENCE SIGNS LIST

1: Substrate, 5: Lower insulating layer, 7: Active layer, 7a1, 7a2: Low-resistance region (low-resistance oxide semiconductor region), 7C: Channel region, 7S: First region, 7D: Second region, 7L: Lower layer of active layer, 7U: Upper layer of active layer, 9: Gate insulating layer, 11: Gate electrode, 13: Upper insulating layer, 15s: Source electrode, 15d: Drain electrode, 15cs: Source contact region, 15cd: Drain contact region, 71: Lower oxide semiconductor layer, 72: Upper oxide semiconductor layer, 71i, 72i: i-type semiconductor layer, 71n, 72n: Impurity-containing semiconductor layer, 73: Middle oxide semiconductor layer, m1: First metal layer, m2: Second metal layer, CHs: First opening, CHd: Second opening, 101 to 107: Oxide semiconductor TFTs

The invention claimed is:

1. A thin film transistor comprising:
a substrate;
an active layer supported on the substrate, the active layer including a first region, a second region, and a channel region located between the first region and the second region;
a gate electrode arranged so as to overlap at least the channel region of the active layer with a gate insulating layer therebetween;
a source electrode electrically connected to the first region of the active layer; and
a drain electrode electrically connected to the second region of the active layer, wherein
at least the channel region having a layered structure includes:
a lower oxide semiconductor layer;
a first metal layer that is continuous, and that is arranged on the lower oxide semiconductor layer and containing substantially no oxygen; and
an upper oxide semiconductor layer arranged on a top surface of the first metal layer, and
a thickness of the first metal layer is smaller than a thickness of the lower oxide semiconductor layer or a thickness of the upper oxide semiconductor layer.

2. The thin film transistor according to claim 1, wherein the lower oxide semiconductor layer, the upper oxide semiconductor layer, and the first metal layer include at least one common metal element.

3. The thin film transistor according to claim 1, wherein at least one of the lower oxide semiconductor layer and the upper oxide semiconductor layer includes an i-type semiconductor layer containing substantially no n-type impurity.

4. The thin film transistor according to claim 1, wherein at least one of the lower oxide semiconductor layer and the upper oxide semiconductor layer includes:
an i-type semiconductor layer containing substantially no n-type impurity; and
an impurity-containing semiconductor layer, arranged between the i-type semiconductor layer and the first metal layer, containing an n-type impurity.

5. The thin film transistor according to claim 1, wherein at least one of the lower oxide semiconductor layer and the upper oxide semiconductor layer contains an n-type impurity, and
an n-type impurity concentration profile, in a thickness direction of the at least one of the lower oxide semiconductor layer and the upper oxide semiconductor layer, includes a gradient region, where a concentration decreases, away from the first metal layer.

6. The thin film transistor according to claim 1, wherein an oxygen concentration profile, in a thickness direction of at least one of the lower oxide semiconductor layer and the upper oxide semiconductor layer, includes a gradient region, where the concentration increases, away from the first metal layer.

7. The thin film transistor according to claim 1, wherein:
the layered structure further includes at least one other metal layer between the lower oxide semiconductor layer and the first metal layer,
the first metal layer and the at least one other metal layer are stacked on each other with a middle oxide semiconductor layer therebetween, and
a thickness of the at least one other metal layer is smaller than the thickness of the lower oxide semiconductor layer or the thickness of the upper oxide semiconductor layer.

8. The thin film transistor according to claim 1, wherein:
the active layer is arranged between the substrate and the gate electrode,
the gate electrode overlaps with the channel region of the active layer and does not overlap with the first region and the second region, as viewed from a direction normal to the substrate, and
upper surfaces of the first region and the second region include low-resistance oxide semiconductor regions, the low-resistance oxide semiconductor regions having a lower specific resistance than an upper surface of the channel region.

9. The thin film transistor according to claim 8, further comprising:
an upper insulating layer that covers the active layer, the gate insulating layer, and the gate electrode, wherein
the source electrode is electrically connected to the low-resistance oxide semiconductor region of the first region in a first opening formed in the upper insulating layer, and
the drain electrode is electrically connected to the low-resistance oxide semiconductor region of the second region in a second opening formed in the upper insulating layer.

10. The thin film transistor according to claim 8, wherein:
the active layer further includes:
a lower layer that includes at least a portion of the lower oxide semiconductor layer, and
an upper layer that is arranged on a portion of the lower layer and that includes the upper oxide semiconductor layer and the first metal layer,
the channel region includes the upper layer and the lower layer, and
each of the first region and the second region includes the lower layer and does not include the upper layer.

11. The thin film transistor according to claim 10, wherein perimeters of the gate electrode, the gate insulating layer, and the upper layer of the active layer are aligned with each other, as viewed from the direction normal to the substrate.

12. The thin film transistor according to claim 8, wherein the thickness of the upper oxide semiconductor layer is greater than the thickness of the lower oxide semiconductor layer.

13. The thin film transistor according to claim 1, wherein the first metal layer contains a plurality of metal elements.

14. The thin film transistor according to claim 13, wherein each of the lower oxide semiconductor layer, the upper oxide semiconductor layer, and the first metal layer contains In, Ga, and Zn.

15. A display device comprising:
a thin film transistor according to claim 1;
a display area including a plurality of pixels; and
pixel circuits arranged so as to correspond, respectively, to the plurality of pixels,
wherein each of the pixel circuits includes the thin film transistor.

16. The display device according to claim 15, further including current-driven light-emitting elements arranged so as to correspond, respectively, to the plurality of pixels, wherein
the pixel circuits drive the current-driven light-emitting elements.

* * * * *